(12) United States Patent
Shao et al.

(10) Patent No.: US 10,978,516 B2
(45) Date of Patent: Apr. 13, 2021

(54) ORGANIC LIGHT-EMITTING DISPLAY PANEL AND DISPLAY DEVICE

(71) Applicant: Wuhan Tianma Micro-Electronics Co., Ltd., Wuhan (CN)

(72) Inventors: Liqin Shao, Wuhan (CN); Sitao Huo, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 108 days.

(21) Appl. No.: 16/386,176

(22) Filed: Apr. 16, 2019

(65) Prior Publication Data

US 2020/0212124 A1 Jul. 2, 2020

(30) Foreign Application Priority Data

Dec. 29, 2018 (CN) .......................... 201811634124.X

(51) Int. Cl.
H01L 27/32 (2006.01)

(52) U.S. Cl.
CPC ...... *H01L 27/3218* (2013.01); *H01L 27/3246* (2013.01); *G09G 2300/0443* (2013.01); *G09G 2300/0465* (2013.01)

(58) Field of Classification Search
CPC ............ H01L 27/3218; H01L 27/3246; G09G 2300/0443; G09G 2300/0465
See application file for complete search history.

(56) References Cited

U.S. PATENT DOCUMENTS

2002/0070909 A1* 6/2002 Asano ................... H01L 27/326
   345/76
2005/0041188 A1* 2/2005 Yamazaki ........... H01L 27/3218
   349/146

(Continued)

FOREIGN PATENT DOCUMENTS

CN    103811533 A    5/2014
CN    104701341 A    6/2015

(Continued)

OTHER PUBLICATIONS

CN Office Action, application No. 201811634124.X, dated May 22, 2020.
CN Office Action, dated Oct. 27, 2020.

*Primary Examiner* — Errol V Fernandes
*Assistant Examiner* — Jeremy J Joy
(74) *Attorney, Agent, or Firm* — Alston & Bird LLP

(57) ABSTRACT

An organic light-emitting display panel includes a plurality of pixel defining aperture regions each having a same shape and size. Each pixel defining aperture region is partitioned into six sub-pixel regions, the six sub-pixels has a same area defined by six boundary lines, each boundary line is a connection line running from a center point to an edge of the pixel defining aperture region. The plurality of the pixel defining aperture regions is characterized with three different colors. The six sub-pixels of any one of the pixel defining aperture regions is characterized with a same color. Two adjacent pixel defining aperture regions are characterized with different colors. Three connection lines between the center points of three adjacent pixel defining aperture regions have different colors constitute an isosceles right triangle, and three sub-pixel regions defined by the isosceles right triangle constitute one pixel unit.

20 Claims, 10 Drawing Sheets

(56) References Cited

U.S. PATENT DOCUMENTS

| | | | | |
|---|---|---|---|---|
| 2006/0290870 A1* | 12/2006 | Kwak | ................ | H01L 27/3218 349/144 |
| 2009/0195144 A1* | 8/2009 | Kitabayashi | ........ | H01L 27/3246 313/503 |
| 2010/0110048 A1* | 5/2010 | Min | ................... | H01L 27/3253 345/204 |
| 2013/0038513 A1* | 2/2013 | Park | ................... | H01L 27/3218 345/55 |
| 2013/0234917 A1* | 9/2013 | Lee | ................... | H01L 27/3218 345/82 |
| 2014/0319484 A1* | 10/2014 | Kwon | ................... | H01L 51/56 257/40 |
| 2015/0015768 A1* | 1/2015 | Tanaka | ............. | H01L 27/14627 348/342 |
| 2015/0021637 A1* | 1/2015 | Ahn | ................... | H01L 27/3218 257/89 |
| 2015/0162391 A1* | 6/2015 | Kim | ................... | H01L 27/3246 257/40 |
| 2015/0311263 A1* | 10/2015 | Shih | ................... | H01L 27/3218 257/40 |
| 2016/0240592 A1* | 8/2016 | Li | ....................... | H01L 27/3216 |
| 2016/0284766 A1* | 9/2016 | Wang | ................. | H01L 27/3211 |
| 2016/0358985 A1* | 12/2016 | Bai | ..................... | G09G 3/3208 |
| 2018/0175121 A1* | 6/2018 | Ji | ........................... | H01L 51/52 |
| 2018/0197442 A1* | 7/2018 | Song | ...................... | G09F 9/302 |
| 2018/0269268 A1* | 9/2018 | Cai | .................... | H01L 27/3211 |
| 2018/0350888 A1* | 12/2018 | Huo | ................... | H01L 27/3258 |
| 2019/0043408 A1* | 2/2019 | Li | ........................ | G09G 3/2074 |
| 2019/0131355 A1* | 5/2019 | Chae | .................... | G09G 3/3258 |
| 2019/0131589 A1* | 5/2019 | Matsueda | ........... | H01L 27/3276 |

FOREIGN PATENT DOCUMENTS

| | | | |
|---|---|---|---|
| CN | 206076238 U | * | 4/2017 |
| CN | 206076238 U | | 4/2017 |
| CN | 106972046 A | | 7/2017 |

* cited by examiner

US 10,978,516 B2

ORGANIC LIGHT-EMITTING DISPLAY PANEL AND DISPLAY DEVICE

CROSS-REFERENCE TO RELATED APPLICATIONS

The present disclosure claims priority to Chinese Patent Application No. CN 201811634124.X, filed on Dec. 29, 2018, the content of which is incorporated herein by reference in its entirety.

TECHNICAL FIELD

The present disclosure relates to the field of display technologies and, particularly, relates to an organic light-emitting display panel and a display device.

BACKGROUND

Among display technologies, an organic light-emitting display (OLED) panel has more and more applications from its excellent characteristics such as self-luminous, high brightness, wide viewing angle and fast response. Light-emitting devices in the organic light-emitting display panel include an anode, a cathode and an organic light-emitting layer. The organic light-emitting layer is located between the anode and the cathode. Electrons and holes are combined in the organic light-emitting layer to realize light emission under the voltage of the anode and the cathode.

However, in the current pixel design, each sub-pixel corresponds to a separate organic light-emitting layer pattern, which requires high patterning precision for the organic light-emitting layer. Therefore, it is difficult to manufacture an organic light-emitting layer pattern having a small region, resulting in a low resolution of the organic light-emitting display panel.

SUMMARY

The present disclosure provides an organic light-emitting display panel and a display device, which can improve a resolution of the organic light-emitting display panel.

In a first aspect, the present provides an organic light-emitting display panel, and the organic light-emitting display panel includes: a plurality of pixel defining aperture regions each having a same shape and a same size as others. For each pixel defining aperture region of the plurality of pixel defining aperture regions, the pixel defining aperture region is partitioned into six sub-pixel regions. Each of the six sub-pixel regions has a same area defined by six boundary lines. Each of the six boundary lines is a connection line running from a center point to an edge of the pixel defining aperture region. The plurality of the pixel defining aperture regions is characterized with three different colors. The six sub-pixel regions of any one of the pixel defining aperture regions is characterized with a same color. Two adjacent pixel defining aperture regions of the plurality of pixel defining aperture regions are characterized with different colors. Three connection lines between the center points of three adjacent pixel defining aperture regions having different colors constitute an isosceles right triangle. Three sub-pixel regions defined by the isosceles right triangle constitute one pixel unit.

In a second aspect, the present disclosure provides a display device, and the display device includes the display panel provided in any embodiment of the present disclosure.

BRIEF DESCRIPTION OF DRAWINGS

In order to better explain the embodiments of the present disclosure or the technical solution in the related art, the drawings to be used in the description of the embodiments or the related art will be briefly described below. The drawings in the following description are some embodiments of the present disclosure. For those skilled in the art, other drawings may also be obtained based on these drawings without paying any creative effort.

DESCRIPTION OF EMBODIMENTS

In order to make the objectives, technical solutions, and advantages of the present disclosure more apparent, the technical solutions of the present disclosure will be further described by embodiments with reference to the accompanying drawings. The described embodiments are some embodiments of the present disclosure, but not all of the embodiments. Other embodiments obtained by those persons skilled in the art based on the embodiments of the present disclosure without creative efforts shall fall within the protection scope of the present disclosure.

The terms used in the embodiments of the present disclosure are merely for the purpose of describing specific embodiment, rather than limiting the present disclosure. The terms "a", "an", "the" and "said" in a singular form in the embodiments of the present disclosure and the attached claims are also intended to include plural forms thereof, unless noted otherwise.

In order to further illustrate the beneficial effects of the embodiments of the present disclosure, a process of discovering the problems of the related art by the inventor is first described before the embodiments of the present disclosure are described in detail.

Figure 1A:
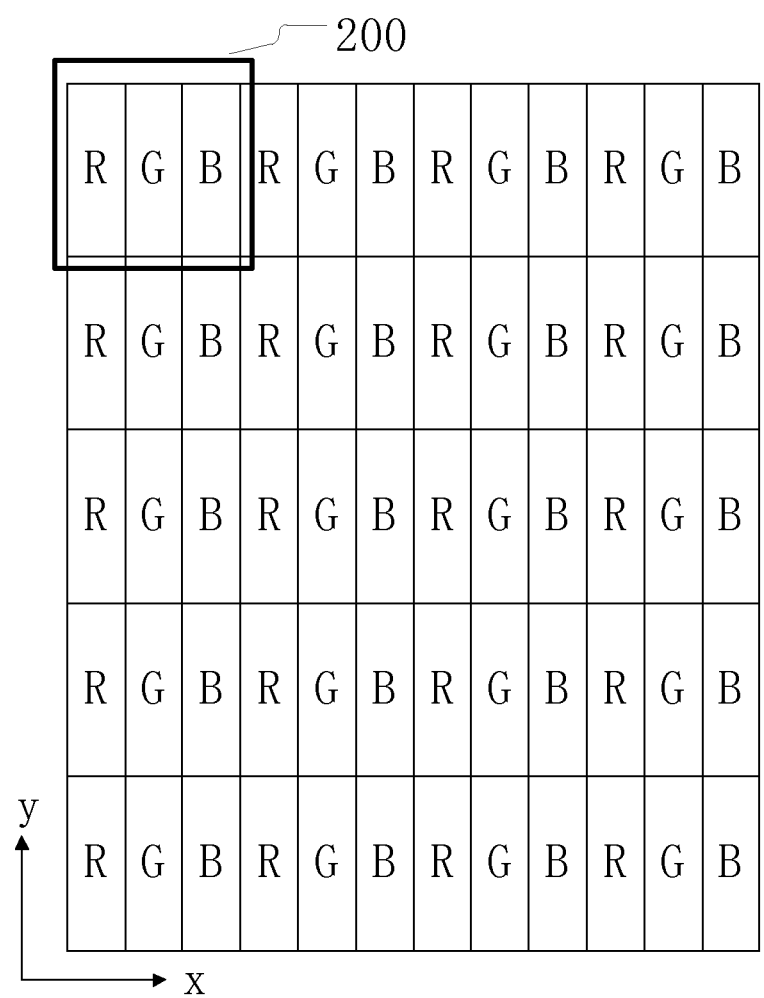
FIG. 1a is a schematic diagram showing a pixel arrangement of an organic light-emitting display panel in the related art.

Referring to FIG. 1a, FIG. 1a is a schematic diagram showing a pixel arrangement of an organic light-emitting display panel in the related art. The pixel arrangement includes a plurality of sub-pixel units 200 arranged in a matrix along a row direction x and a column direction y. Each of the plurality of sub-pixel units 200 includes three sub-pixel elements having different colors. The three sub-pixel elements are arranged in the row direction. With the display panel thus designed, each pixel has a same shape and orientation, and can be designed with a same pixel circuit. Signal lines such as a scan line, a data line, a light-emitting control line, a high-voltage line, a low-voltage line, and the like are arranged in a row or column direction due to a regular arrangement of the respective sub-pixels, thereby achieving a simple design. However, in such an organic light-emitting display panel, since each sub-pixel is required to be separately vapor-deposited with an organic light-emitting material, it is unable to keep up with the increasingly high resolution requirements due to evaporation precision and equipment.

Figure 1B:
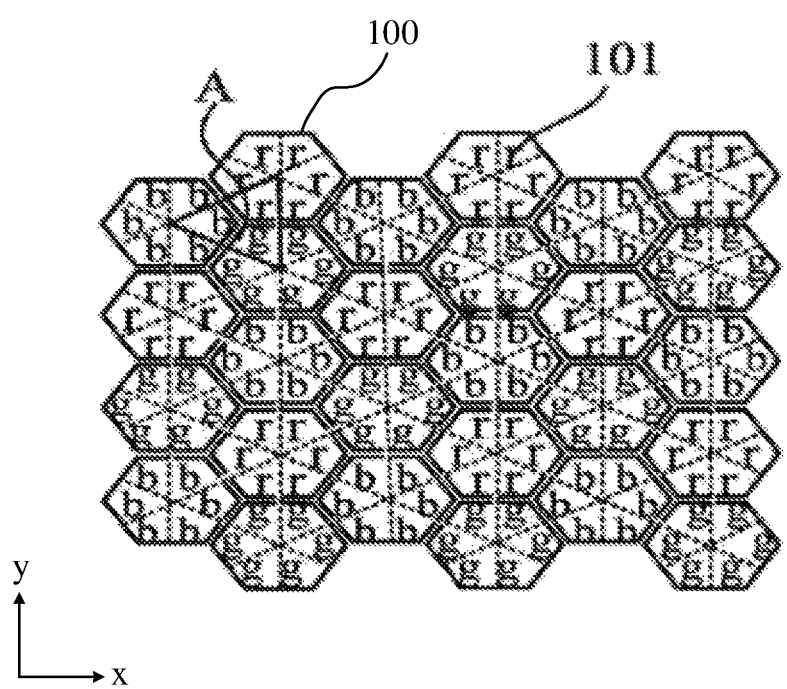
FIG. 1b is a schematic diagram showing another pixel arrangement of an organic light-emitting display panel in the related art.

As the display resolution is increased, a pixel arrangement manner occurs due to the limitation of the patterning process difficulty of the organic light-emitting layer. As shown in FIG. 1b, FIG. 1b is a schematic diagram showing a pixel arrangement of an organic light-emitting display panel in the related art. The pixel arrangement includes a plurality of sub-pixel units 100 each having the same shape and size. Each of the plurality of sub-pixel units 100 is composed of six sub-pixel elements 101 having a same color. The sub-pixel unit 100 has three different colors. Connection lines between the centers of adjacent three sub-pixel units constitutes an equilateral triangle. The above three sub-pixel elements defined by the equilateral triangle constitute one pixel unit A in which r represents red, g represents green, and b represents blue. Since the sub-pixel unit 100 includes six sub-pixel elements 101 having a same color which are adjacent to each other, the organic light-emitting layer can be patterned with the sub-pixel unit 100 as the smallest patterned region, that is, the resolution of the organic light-emitting display panel can be improved. However, since the six sub-pixels are a quadrangle including an acute angle, and the sub-pixel unit 100 is in a shape of an equilateral hexagon, which is closely arranged in the entire display panel. Since the six sub-pixels having a same color need to separately emit light, each sub-pixel element 101 is required to be correspondingly provided with a corresponding pixel driving circuit. Compared with a full-array display panel in the related art, the sub-pixels are arranged in a matrix of rows and columns. In the display panel shown in FIG. 1a, the sub-pixel elements 101 are not arranged in rows and columns, so that the layout of the pixel circuit is very complex, and the layout of scan lines, data lines, light-emitting control lines, high-voltage lines, low-voltage lines, etc. are also difficult to arrange. The pixel unit for display composed of three adjacent sub-pixel elements of different colors in FIG. 1b is an equilateral triangle. The space occupied by three pixel driving circuits corresponding to one pixel unit is in a shape of square. The regular hexagon composed by six sub-pixels cannot be compatible with the design principle of the conventional pixel driving circuit.

Figure 2:
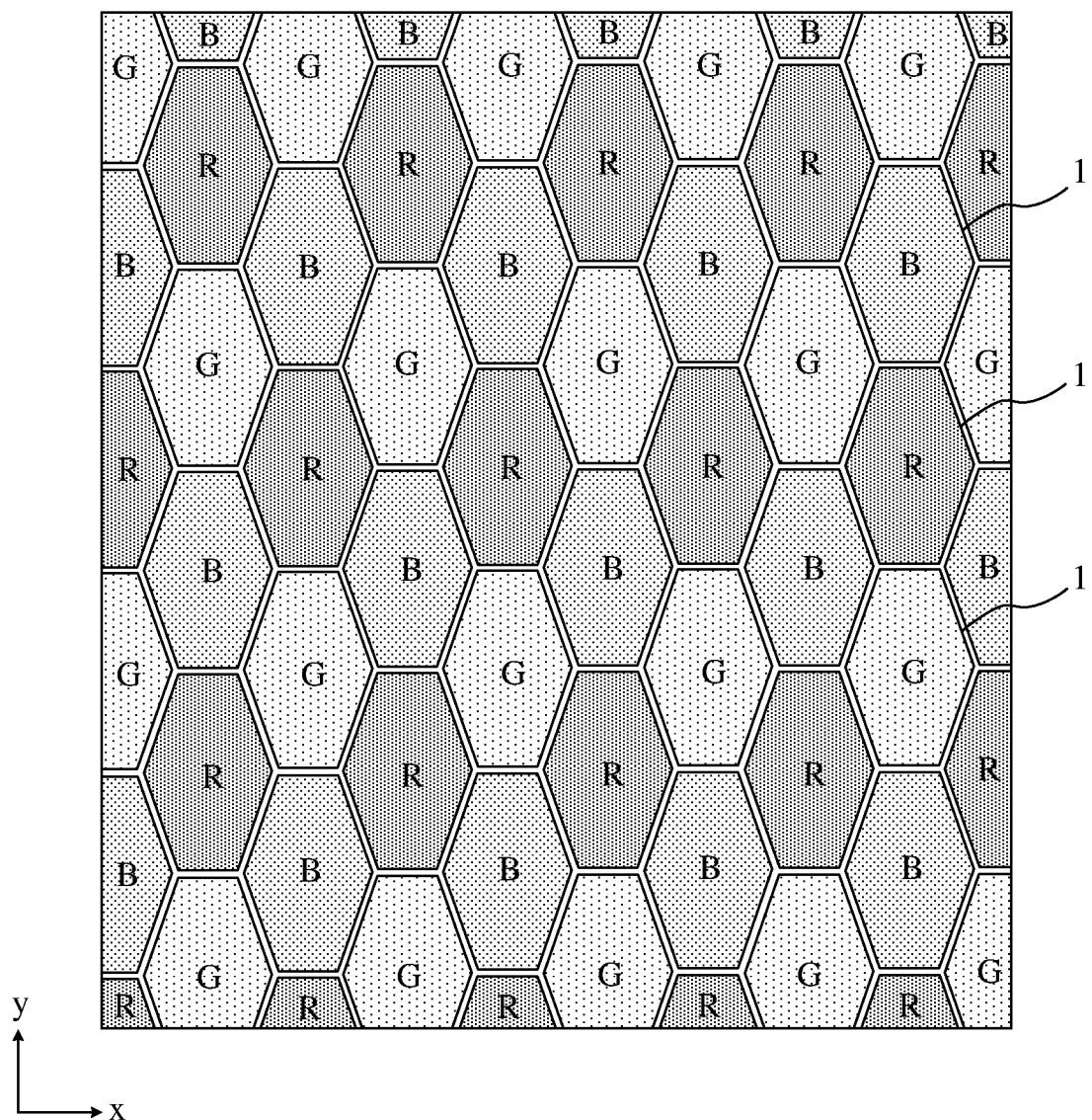
FIG. 2 is a schematic diagram showing an arrangement of a portion of pixel aperture regions in an organic light-emitting display panel according to an embodiment of the present disclosure.
Figure 3:
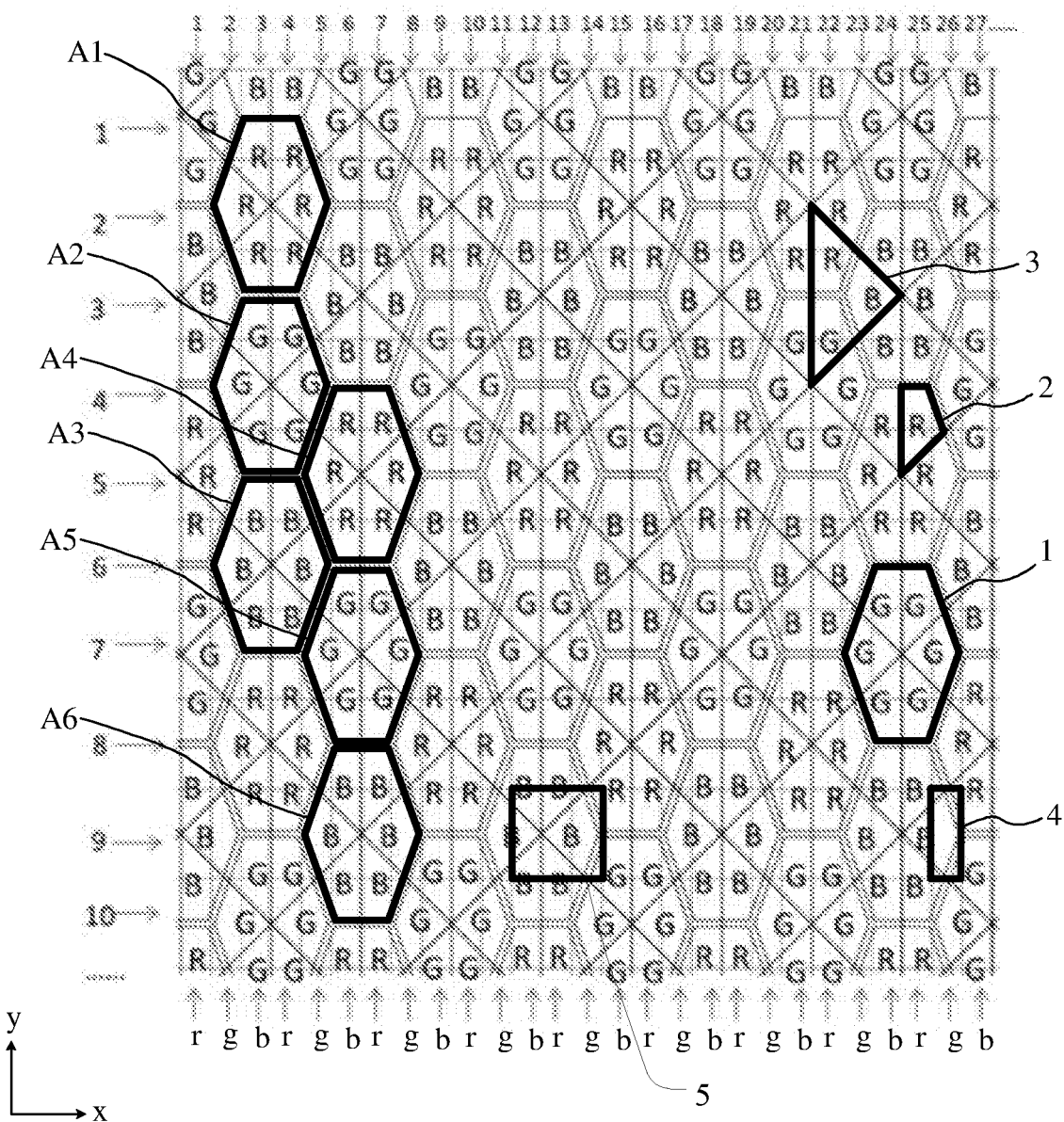
FIG. 3 is a schematic diagram showing the arrangement of a portion of sub-pixel region in the organic light-emitting display panel in FIG. 2.
Figure 4:
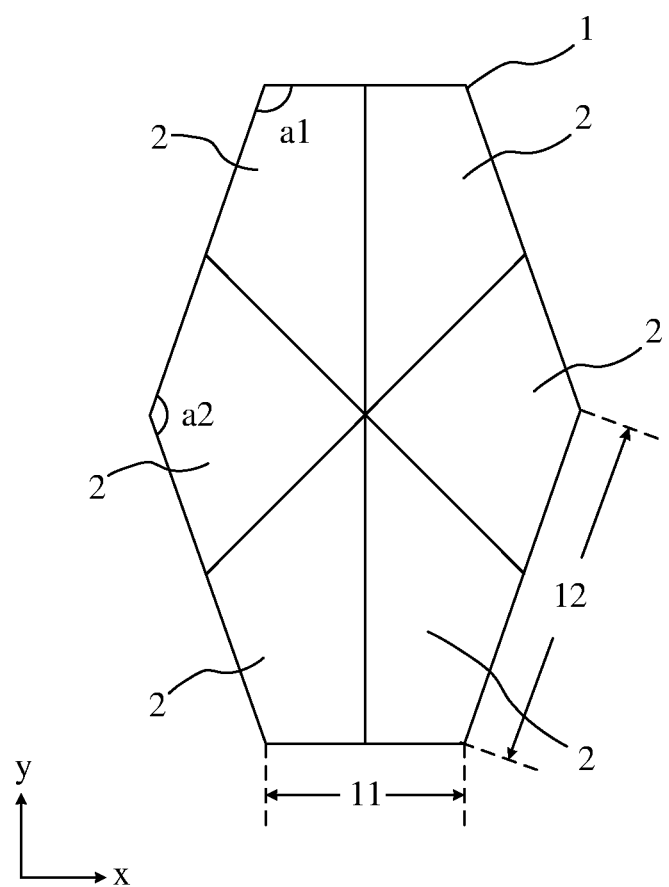
FIG. 4 is an enlarged schematic diagram showing one pixel defining aperture region in FIG. 2.
Figure 5:
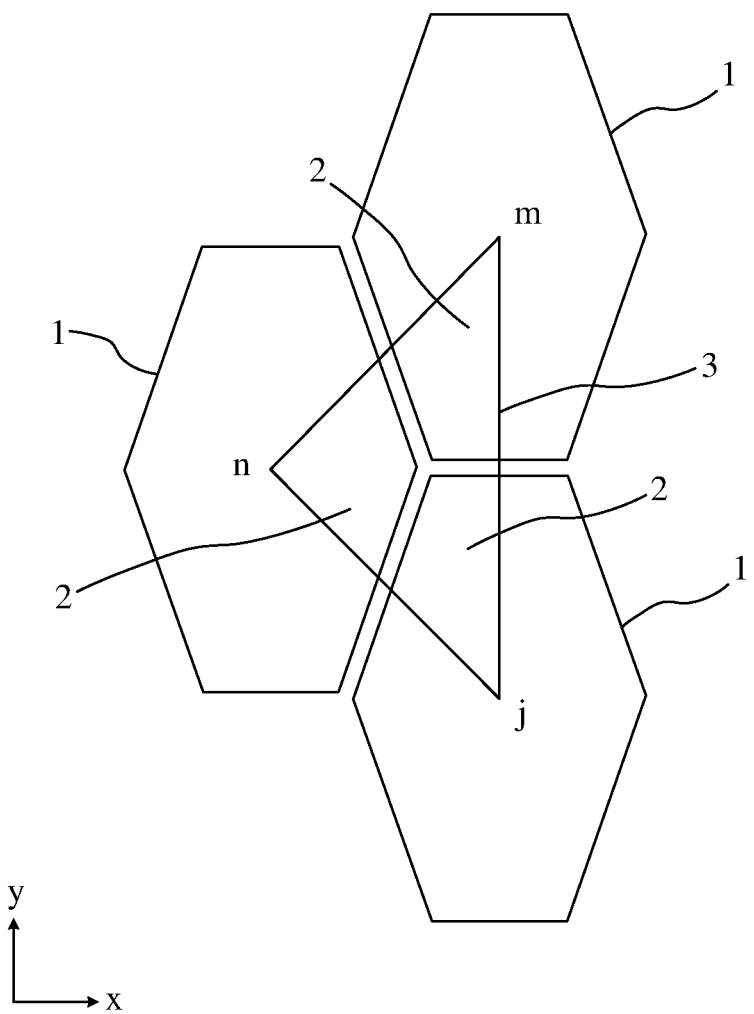
FIG. 5 is an enlarged schematic diagram showing three pixel defining aperture regions adjacent to each other and having different colors.

As shown in FIGS. 2-5, FIG. 2 is a schematic diagram showing an arrangement of a portion of pixel aperture regions in an organic light-emitting display panel according to an embodiment of the present disclosure; FIG. 3 is a schematic diagram showing the arrangement of a portion of sub-pixel region in the organic light-emitting display panel in FIG. 2; FIG. 4 is an enlarged schematic diagram showing one pixel defining aperture region in FIG. 2; and FIG. 5 is an enlarged schematic diagram showing three pixel defining aperture regions adjacent to each other and having different colors in FIG. 2. The present disclosure provides an organic light-emitting display panel. The organic light-emitting display panel includes: a plurality of pixel defining aperture regions 1 having a same shape and a same size. In each of the plurality of pixel defining aperture regions 1, a connection line from a center point to an edge of the pixel defining aperture region is regarded as a boundary line. The pixel defining aperture region 1 is partitioned into six sub-pixel regions having a same area. The same one pixel defining aperture region 1 includes six sub-pixel regions 2 having a same color. The pixel defining aperture region 1 has three different colors. Any two adjacent pixel defining aperture regions 1 have different colors. Connection lines between the center points of any three pixel defining aperture regions 1 adjacent to each other and having different color constitute an isosceles right triangle. Three sub-pixel regions 2 defined by the isosceles right triangle constitute one pixel unit 3.

The pixel defining aperture region 1 is configured to define a pattern of the organic light-emitting layer of the light-emitting device in the organic light-emitting display panel. The sub-pixel region 2 is a smallest possible separately controllable light-emitting region. Three sub-pixel regions 2 having different colors constitute a pixel unit 3. One color pixel is realized by superposition of three colors of red, green, and blue. The pixel defining aperture region 1 includes six sub-pixel regions 2 having a same color. Therefore, the minimum pattern of the organic light-emitting layer has an area of six sub-pixels, while in the related art, the minimum pattern of the organic light-emitting layer has an area of one sub-pixel. Therefore, in the embodiments of the disclosure, the requirement for the patterning precision of the organic light-emitting layer is relatively low, so that the resolution of the organic light-emitting display panel can be improved. In addition, in the embodiments of the present disclosure, the pixel unit 3 corresponds to an isosceles right triangle, and can be compatible with a design principle of the conventional pixel driving circuit.

Taking the pixel arrangement manner shown in FIGS. 2-3 as an example, the organic light-emitting display panel in the embodiments of the present disclosure can be compatible with the design principle of the conventional pixel driving circuit. In FIG. 3, the arrangement of the pixel driving circuit is also illustrated. FIG. 3 shows the arrangement of the pixel driving circuit of the sub-pixels corresponding to 10*9 display pixels (that is, 10 rows and 9 columns of display pixels). Here, the display pixel refers to the minimum pixel unit of the image to be displayed. The display pixels each have a color to be displayed. Since the red, green and blue primary colors after mixing can display various colors, the pixels to be displayed generally include gray-scale information of three channels of red, green and blue. That is, one display pixel can be divided into three display sub-pixels. The gray-scale information of the display sub-pixels is in one-to-one correspondence with the sub-pixels. The brightness is displayed by each sub-pixel, that is, the final display is completed. Therefore, when 10 rows and 9 columns of display pixels are required to display, 10 rows and 27 columns of sub-pixels are required, that is, a pixel driving circuit of 10 rows and 27 columns is required. Referring to FIG. 3, a plurality of pixel driving units 5 are included in the pixel driving circuit. Each of the plurality of pixel driving units 5 includes three pixel driving circuits 4 arranged in the row direction x. The pixel driving circuit 4 has a space occupied by the pixel driving circuit 4 corresponding to one sub-pixel. Each of the three smallest rectangular pixel driving circuits 4 constitute a square pixel driving unit 5 corresponding to the pixel unit 3 of an isosceles right triangle. Each of the pixel driving circuits 4 is configured to drive one sub-pixel region 2. Three pixel driving circuits 4 are configured to drive one pixel unit 3. In this embodiment, the pixel driving circuit 4 has a rectangular shape. The plurality of pixel driving circuits are arranged in the row direction and the column direction. A square pixel driving unit 5 is configured to drive the pixel unit 3 of an isosceles right triangle. By using the driving circuit with such a structure, the pixel driving circuit arranged in the rectangular matrix of the related art can be directly used. The signal lines such as the scanning line, the data line, the light-emitting control line, the high-voltage line, and the low-voltage line can be arranged in the row direction or in the column direction, so that the design is simple. Moreover, because the pixel defining aperture region 1 includes six adjacent sub-pixel elements 2 having a same color, the organic light-emitting layer can be patterned by using the pixel defining aperture region 1 as the smallest patterned region, that is, the resolution of the organic light-emitting display panel can be improved.

Hereinafter, the feasibility of the pixel unit 3 of the isosceles right triangle corresponding to the square pixel driving unit 5 will be described with reference to the drawings. Referring to FIGS. 3 and 4, it is assumed that a length of the short side of each of the smallest rectangle is a, and the adjacent three rectangles form a square, that is, a length of the long side of the rectangle is 3a. An area occupied by the pixel driving circuit 4 corresponding to one pixel unit 3 is an area of three rectangles, that is, an area of $9a^2$. The length of the oblique side of the isosceles right triangle corresponding to one pixel unit 3 is the length of two long sides of the rectangle, that is, a length of 6a. The length of the height on the oblique side of the isosceles right triangle is 3a. The area of the isosceles right triangle is $9a^2$, that is, it can be ensured that the area occupied by one pixel unit 3 is equal to the area occupied by the pixel driving circuit 4 corresponding to one pixel unit 3. Further, a distance between the centers of two pixel defining aperture regions 1 adjacent to each other along the long side of the pixel defining aperture region 1 in the row direction x is 3a, and a distance between the centers of two pixel defining aperture regions 1 adjacent to each other along the long side of the pixel defining aperture region 1 in the column direction y is also 3a. A pitch of the pixel unit 3 for display in a shape of an isosceles right triangle is 3a in the row direction. A pitch of the pixel unit 3 for display in a shape of an isosceles right triangle is also 3a in the column direction. In the arrangement of the driving circuits, a pitch of the square pixel driving unit 510 in the row direction is 3a, and a pitch of the square pixel driving unit 510 in the column direction is also 3a. That is, the finally formed display panel can achieve that the pixel unit and the pixel driving unit 5 have the same pitch in both the row direction and the column direction, so that the organic light-emitting display panel in the embodiments can be compatible with the design principle of the conventional pixel driving circuit. That is, a driving circuit is designed with a matrix, and a specially designed organic light-emitting film layer is used. The organic light-emitting film layer includes a plurality of specially designed quadrilateral anodes. Each of the plurality of anodes is correspondingly connected to an output terminal of a driving transistor included in one rectangular pixel driving circuit 4. Therefore, it is possible to drive a specially designed organic light-emitting film layer by using a conventional driving circuit.

In FIG. 2, R indicates that the corresponding sub-pixel region 2 is configured to display in red color, G indicates that the corresponding sub-pixel region 2 is configured to display in green color, B indicates that the corresponding sub-pixel region 2 is configured to display in blue color, the x-axis direction is a row direction, and the y-axis direction is a column direction. In FIG. 3, the Arabic numerals from 1 to 27 arranged in the x-axis direction indicate the serial numbers of the columns corresponding to the pixel driving circuit 4, the Arabic numerals from 1 to 10 arranged in the y-axis direction indicate the serial numbers of the rows corresponding to the pixel driving circuit 4, r indicates that the corresponding column of the pixel driving circuit 4 is configured to drive the sub-pixel regions 2 displaying in red color, g indicates that the corresponding column of the pixel driving circuit 4 is configured to drive the sub-pixel regions 2 displaying in green color, and b indicates that the corresponding column of the pixel driving circuit 4 is configured to drive the sub-pixel regions 2 displaying in blue color. For example, the six sub-pixel regions 2 in the pixel defining aperture region A1 are all configured to display in red color, so that the six sub-pixel regions 2 can correspond to six pixel driving circuits 4 in the first row and the first column, the second row and the first column, the third row and the first column, the first row and the fourth column, the second row and the fourth column, the third row and the fourth column, respectively. Six sub-pixel regions 2 in the pixel defining aperture region A2 are all configured to display in green color, so that the six sub-pixel regions 2 can correspond to six pixel driving circuits 4 in the third row and the second column, the fourth row and the second column, the fifth row and the second column, the third row and the fifth column, the fourth row and the fifth column, the fifth row and the fifth column, respectively. Six sub-pixel regions 2 in the pixel defining aperture region A3 are all configured to display in blue color, so that the six sub-pixel regions 2 can correspond to six pixel driving circuits 4 in the fifth row and the third column, the sixth row and the third row, the seventh row and the third column, the fifth row and the sixth column, the sixth row and the sixth column, the seventh row and the sixth column, respectively. Six sub-pixel regions 2 in the pixel defining aperture region A4 are all configured to display in red color, so that the six sub-pixel regions 2 can correspond to six pixel driving circuits 4 at the fourth row and the fourth column, the fifth row and the fourth column, the sixth row and the fourth column, the fourth row and the seventh column, the fifth row and the seventh column, the sixth row and the seventh column, respectively. Six sub-pixel regions 2 in the pixel defining aperture region A5 are all configured to display in green color, so that the six sub-pixel regions 2 can correspond to six pixel driving circuits 4 at the sixth row and the fifth column, the seventh row and the fifth column, the eighth row and the fifth column, the sixth row and the eighth column, the seventh row and the eighth column, the eighth row and the eighth column, respectively. Six sub-pixel regions 2 in the pixel defining aperture region A6 are all configured to display in blue color, so that the six sub-pixel regions 2 can correspond to six pixel driving circuits 4 at the eighth row and the sixth column, the ninth row and the sixth column, the tenth row and the sixth column, the eighth row and the ninth column, the ninth row and the ninth column, the tenth row and the ninth column, respectively, etc. It is possible that each of the pixel driving circuits 4 can exactly correspond to one sub-pixel region 2. It should be noted that the corresponding manner in FIG. 2 is only an example, and the correspondence relationship between the specific pixel driving circuit 4 and the sub-pixel region 2 in the embodiments of the present disclosure is not limited thereto. It can be seen that the pixel arrangement manner in the embodiments of the present disclosure can make the pixel driving circuit 4 and the sub-pixel region 2 exactly in one-to-one correspondence when it is matched with a conventional design in which the space occupied by three adjacent pixel driving circuits 4 is a square. 270 pixel driving circuits 4 in FIG. 2 can be in one-to-one correspondence with 270 sub-pixel regions 2 occupied by the same space.

In the organic light-emitting display panels of the embodiments of the present disclosure, the pixel defining aperture region includes six sub-pixels having a same color. Therefore, the minimum pattern of the organic light-emitting layer has an area of six sub-pixels. Compared with the related art, the requirement for the patterning precision of the organic light-emitting layer is lower, so that the resolution of the organic light-emitting display panel can be improved. In the embodiments of the present disclosure, one pixel unit corresponds to an isosceles right triangle, which can be compatible with the design principle of the conventional pixel driving circuit.

In the embodiments of the present disclosure, as shown in FIGS. 2-5, each of the plurality of pixel defining aperture region 1 has a shape of hexagon.

In the embodiments of the present disclosure, the hexagon described above includes two equal short sides 11 and four equal long sides 12, the two short sides 11 are opposite and parallel to each other, and a ratio of the short side 11 to the long side 12 is e1, $$(2/\sqrt{10}) \times (1-90\%) < e1 < (2/\sqrt{10}) \times (1+90\%).$$

Theoretically, as shown in FIGS. 3 and 4, the pixel unit 3 corresponds to an isosceles right triangle. n, m, and j are respectively three vertices of an isosceles right triangle. An angle between a line segment nm and a line segment nj is a right angle. The sub-pixel regions 2 each has an equal area, which can be obtained by a geometric relationship. Each side of the isosceles right triangle passes through the midpoint of the side of the corresponding hexagon. The apex angle a1 of the hexagon is equal to 108.44°, the apex angle a2 of the hexagon is equal to 143.13°, and a ratio of the short side 11 to the long side 12 of each side of the hexagon is $2/\sqrt{10}$, which can be obtained by a geometric relationship. However, the ratio of the short side 11 to the long side 12 of the hexagon are defined to be $(2/\sqrt{10}) \times (1-90\%) < e1 < (2/\sqrt{10}) \times (1+90\%)$ in consideration of the processing error.

In the embodiments of the present disclosure, $e1 = 2/\sqrt{10}$.

In the embodiments of the present disclosure, as shown in FIGS. 3 and 4, in each of the plurality of pixel defining aperture regions 1, a connection line from a center point to a midpoint of each side of the hexagon is regarded as a boundary line. The pixel defining aperture region 1 is partitioned into six sub-pixel regions 2 having a same area.

Figure 6:
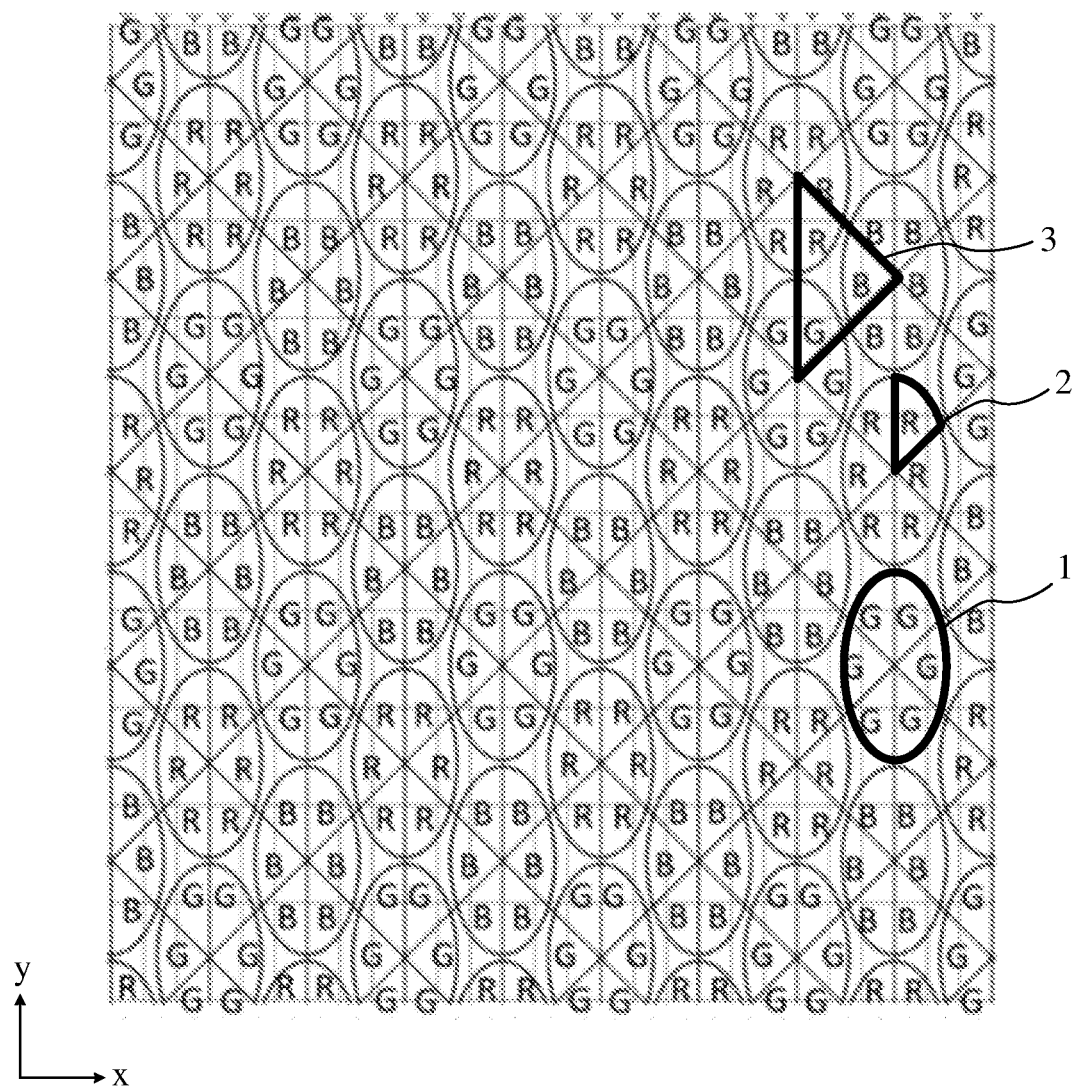
FIG. 6 is a schematic diagram showing an arrangement of a portion of pixel aperture regions in an organic light-emitting display panel according to another embodiment of the present disclosure.
Figure 7:
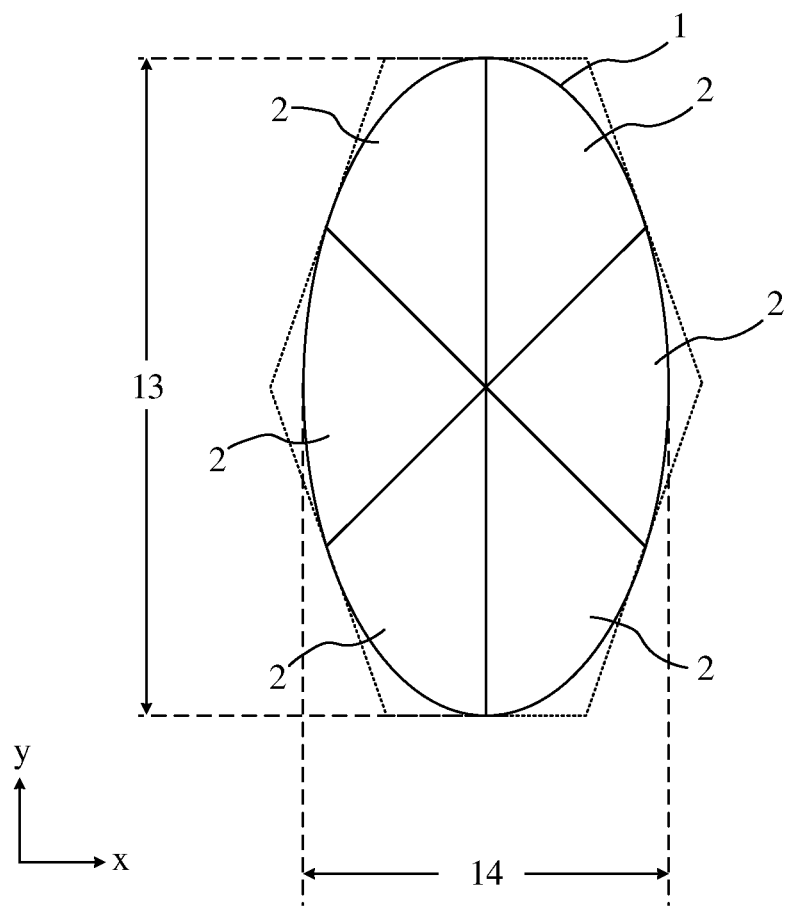
FIG. 7 is an enlarged schematic diagram showing one pixel defining aperture region in FIG. 6.
Figure 8:
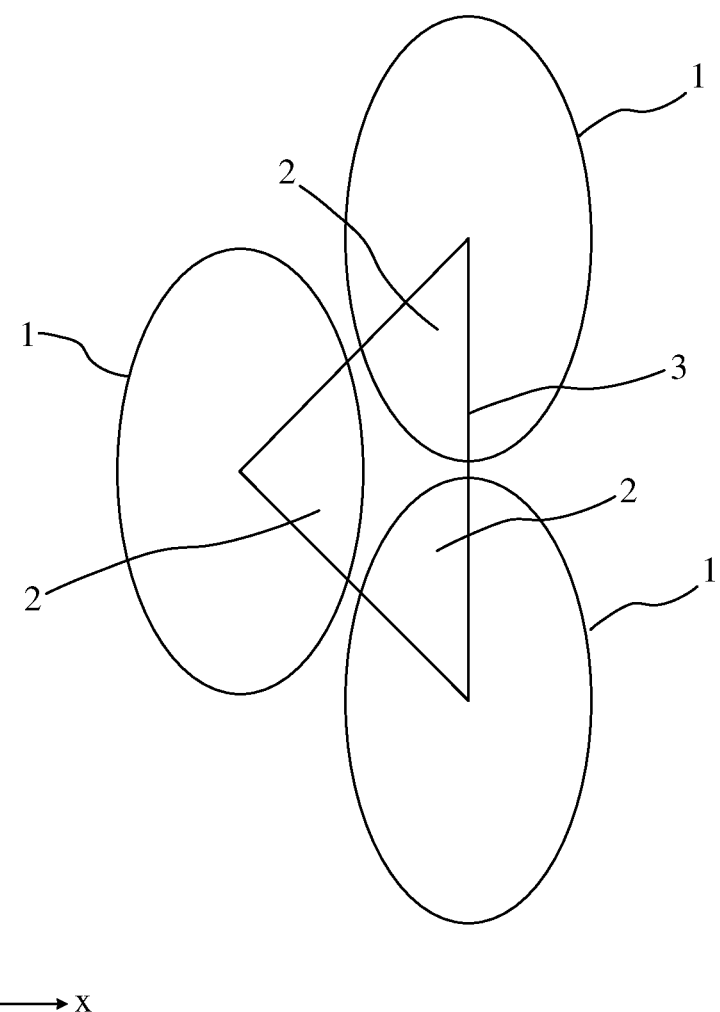
FIG. 8 is an enlarged schematic diagram showing three pixel defining aperture regions adjacent to each other and having different colors in FIG. 6.

In the embodiments of the present disclosure, as shown in FIGS. 6-8, FIG. 6 is a schematic diagram showing an arrangement of a portion of pixel aperture regions in an organic light-emitting display panel according to another embodiment of the present disclosure; FIG. 7 is an enlarged schematic diagram showing one pixel defining aperture region in FIG. 6; and FIG. 8 is an enlarged schematic diagram showing three pixel defining aperture regions adjacent to each other and having different colors in FIG. 6. Each of the plurality of pixel defining aperture regions 1 has a shape of ellipse.

Due to limitations of the process and the like, in an actual organic light-emitting display panel, it is difficult to manufacture a hexagonal pattern. Therefore, based on the pixel defining aperture region 1 of the hexagon, the pixel defining aperture region 1 can be designed with a shape of an ellipse. The ellipse is inscribed in the six sides of the hexagon described in the above embodiments. The specific principle and the relationship between the ellipse and the sub-pixel region 2 or the pixel unit 3 are same as those described in the above embodiments, which are not elaborated here.

In the embodiments of the present disclosure, the ellipse has a ratio e2 of a major axis 13 to a minor axis 14, $$(29/16) \times (1-90\%) < e2 < (29/16) \times (1+90\%)$$

In the embodiments of the present disclosure, $e2 = 29/16$. The relationship between the major axis 13 and the minor axis 14 of the ellipse can be obtained from the geometric relationship of the ellipse. When considering the processing error, the ratio of the major axis 13 to the minor axis 14 of the ellipse is defined to be $(29/16) \times (1-90\%) < e2 < (29/16) \times (1+90\%)$. Without considering the processing error, the ratio of the major axis 13 to the minor axis 14 of the ellipse is 29/16.

In the embodiments of the present disclosure, the pixel defining aperture region 1 described above includes a red pixel defining aperture region, a blue pixel defining aperture region, and a green pixel defining aperture region.

Figure 9:
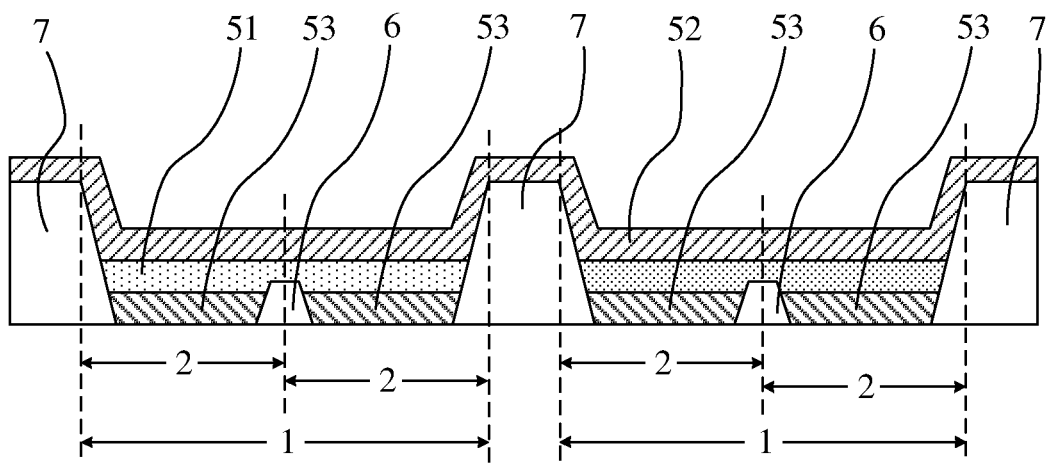
FIG. 9 is a cross-sectional structural schematic diagram showing a partial region of an organic light-emitting display panel according to an embodiment of the present disclosure.

As shown in FIG. 9, FIG. 9 is a cross-sectional structural schematic diagram showing a partial region of an organic light-emitting display panel according to an embodiment of the present disclosure. For example, the pixel defining aperture region 1 may be a region defined by an aperture formed by the pixel definition layer 7. A plurality of organic light-emitting layers 51 having a same color is arranged in each of the pixel defining aperture region 1. The color of the pixel defining aperture region 1 refers to the color of the light emitted corresponding to the organic light-emitting layer 51. R represents red, G represents green, and B represents blue. In a same one pixel defining aperture region 1, the organic light-emitting layers 51 have a same color. The sub-pixel region 2 is configured to define a light-emitting region corresponding to one sub-pixel. One sub-pixel region 2 corresponds to one light-emitting device, which can be individually controlled. The light-emitting device includes an organic light-emitting layer 51, a cathode 52 and an anode 53. The anodes 53 of each of the light-emitting devices are independent from each other. The anodes 53 in the different pixel defining aperture regions 1 are separated by the pixel definition layer 7. In the same one pixel defining aperture regions 1, the anodes 53 in the different sub-pixel regions 2 may be separated by a barrier wall 6. The organic light-emitting layers 51 in the different pixel defining aperture regions 1 are independent from each other. The organic light-emitting layers 51 in the same one pixel defining aperture region 1 is a continuous whole-layer structure in order to be patterned. The cathode 52 may be attached in a whole layer to the light-emitting region of the organic light-emitting display panel, that is, continuously covering all pixel defining aperture regions 1. The anode 53 of each of the sub-pixel regions 2 is electrically connected to a corresponding pixel driving circuit, and is driven and controlled by a pixel driving circuit. After a voltage is applied to the anode 53 and the cathode 52 of the light-emitting device, holes and electrons are respectively injected from the anode 53 and the cathode 52 into the organic light-emitting layer 51. The holes and electrons are combined in the organic light-emitting layer 51 to release energy in order to emit light. The organic light-emitting display panel realizes the image display by the light emission of the light-emitting devices in each of the sub-pixel regions 2.

Figure 10:
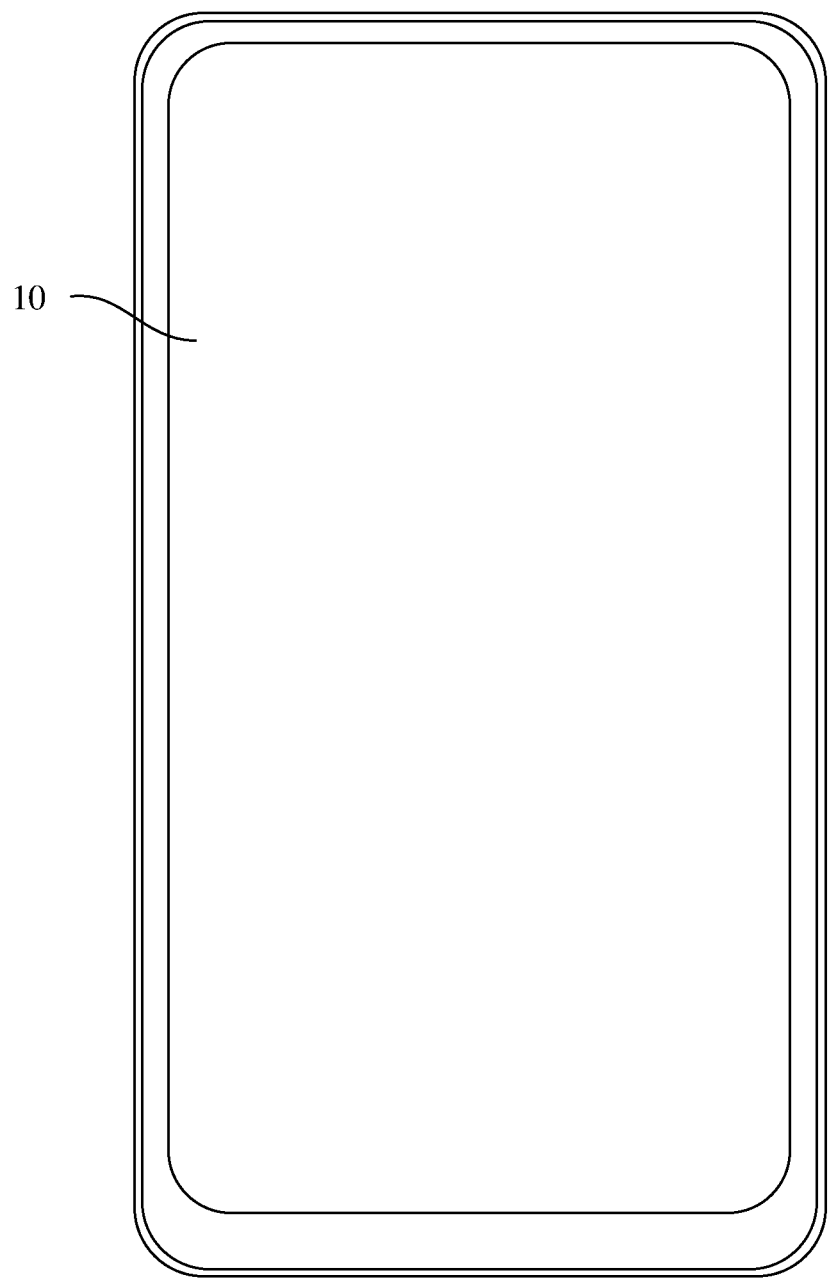
FIG. 10 is a structural schematic diagram showing a display device according to an embodiment of the present disclosure.

As shown in FIG. 10, FIG. 10 is a structural schematic diagram showing a display device according to an embodiment of the present disclosure. The embodiments of the present disclosure further provide a display device including the organic light-emitting display panel 10 described above.

The specific structure of the organic light-emitting display panel 10 is same as that of the above embodiments, which is not elaborated here. The display device may be any electronic device having a display function such as a mobile phone, a tablet computer, a laptop computer, an electronic paper book, or a television.

In the display devices of the embodiments of the present disclosure, the pixel defining aperture region includes six sub-pixels having a same color. Therefore, the minimum pattern of the organic light-emitting layer has an area of six sub-pixels. Compared with the related art, the requirement for the patterning precision of the organic light-emitting layer is lower, so that the resolution of the organic light-emitting display panel can be improved. In the embodiments of the present disclosure, one pixel unit corresponds to an isosceles right triangle, which can be compatible with the design principle of the conventional pixel driving circuit.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various obvious modifications, readjustments, and substitutions without departing from the scope of the present disclosure.

What is claimed is:

1. An organic light-emitting display panel, comprising:
a plurality of pixel defining aperture regions each having a same shape and a same size as others;
wherein each pixel defining aperture region of the plurality of pixel defining aperture regions is partitioned into six sub-pixel regions, wherein each of the six sub-pixel regions has a same area defined by six boundary lines, wherein each of the six boundary lines is a connection line running from a center point to an edge of the pixel defining aperture region;
wherein the plurality of the pixel defining aperture regions is characterized with three different colors;
wherein the six sub-pixel regions of any one of the pixel defining aperture regions is characterized with a same color;
wherein two adjacent pixel defining aperture regions of the plurality of pixel defining aperture regions are characterized with different colors;
wherein three connection lines between the center points of three adjacent pixel defining aperture regions having different colors constitute an isosceles right triangle, and wherein three sub-pixel regions defined by the isosceles right triangle constitute one pixel unit; and
wherein three sides of the isosceles right triangle are formed by edges of the three sub-pixel regions.

2. The organic light-emitting display panel according to claim 1, wherein
each of the plurality of pixel defining aperture region has a shape of hexagon.

3. The organic light-emitting display panel according to claim 2, wherein
the hexagon comprises two short sides having a same length and four long sides having a same length, the two short sides are opposite and parallel to each other, and a ratio of one of the two short sides to one of the four long sides is e1,
wherein e1 satisfies an equation of $(2/\sqrt{10}) \times (1-90\%) < e1 < 1.$ 4. The organic light-emitting display panel according to claim 3, wherein $e1 = 2/\sqrt{10}.$ 5. The organic light-emitting display panel according to claim 2, wherein
the connection line is from the center point to a midpoint of one side of the hexagon.

6. The organic light-emitting display panel according to claim 1, wherein
the plurality of pixel defining aperture regions each has a shape of ellipse.

7. The organic light-emitting display panel according to claim 6, wherein
the ellipse has a major axis and a minor axis, a ratio of the major axis to the minor axis is e2, wherein e2 satisfies an equation of $1 < e2 < (29/16) \times (1+90\%)$.

8. The organic light-emitting display panel according to claim 7, wherein $e2 = 29/16$.

9. The organic light-emitting display panel according to claim 1, wherein
the plurality of pixel defining aperture regions at least comprises a red pixel defining aperture region, a blue pixel defining aperture region, and a green pixel defining aperture region.

10. A display device, comprising an organic light-emitting display panel, wherein the organic light-emitting display panel comprises:
a plurality of pixel defining aperture regions each having a same shape and a same size as others, wherein each pixel defining aperture region of the plurality of pixel defining aperture regions is partitioned into six sub-pixel regions, wherein each of the six sub-pixel regions has a same area defined by six boundary lines, wherein each of the six boundary lines is a connection line running from a center point to an edge of the pixel defining aperture region;
wherein the plurality of the pixel defining aperture regions is characterized with three different colors;
wherein the six sub-pixel regions of any one of the pixel defining aperture regions is characterized with a same color;
wherein two adjacent pixel defining aperture regions of the plurality of pixel defining aperture regions are characterized with different colors;
wherein three connection lines between the center points of three adjacent pixel defining aperture regions having different colors constitute an isosceles right triangle, and wherein three sub-pixel regions defined by the isosceles right triangle constitute a pixel unit; and
wherein three sides of the isosceles right triangle are formed by edges of the three sub-pixel regions.

11. An organic light-emitting display panel, comprising:
a plurality of pixel defining aperture regions each having a same shape and a same size as others; and
a plurality of pixel driving units each comprising three pixel driving circuits, wherein each pixel defining aperture region of the plurality of pixel defining aperture regions is partitioned into six sub-pixel regions, wherein each of the six sub-pixel regions has a same area defined by six boundary lines, wherein each of the six boundary lines is a connection line running from a center point to an edge of the pixel defining aperture region;

wherein the plurality of the pixel defining aperture regions is characterized with three different colors;

wherein the six sub-pixel regions of any one of the pixel defining aperture regions is characterized with a same color;

wherein two adjacent pixel defining aperture regions of the plurality of pixel defining aperture regions are characterized with different colors;

wherein three connection lines between the center points of three adjacent pixel defining aperture regions having different colors constitute an isosceles right triangle, and wherein three sub-pixel regions defined by the isosceles right triangle constitute a pixel unit; and wherein an area of each of the plurality of pixel driving units is equal to an area of the pixel unit.

12. The organic light-emitting display panel according to claim 11, wherein each of the plurality of pixel driving units has a square shape.

13. The organic light-emitting display panel according to claim 12, wherein the three pixel driving circuits each has a same shape as others.

14. The organic light-emitting display panel according to claim 11, wherein each of the plurality of pixel defining aperture region has a shape of hexagon.

15. The organic light-emitting display panel according to claim 14, wherein the hexagon comprises two short sides having a same length and four long sides having a same length, the two short sides are opposite and parallel to each other, and a ratio of one of the two short sides to one of the four long sides is e1, wherein e1 satisfies an equation of $(2/\sqrt{10}) \times (1-90\%) < e1 < 1$.

16. The organic light-emitting display panel according to claim 15, wherein $e1 = 2/\sqrt{10}$.

17. The organic light-emitting display panel according to claim 14, wherein the connection line is from the center point to a midpoint of one side of the hexagon.

18. The organic light-emitting display panel according to claim 11, wherein the plurality of pixel defining aperture regions each has a shape of ellipse.

19. The organic light-emitting display panel according to claim 18, wherein the ellipse has a major axis and a minor axis, a ratio of the major axis to the minor axis is e2, wherein e2 satisfies an equation of $1 < e2 < (29/16) \times (1+90\%)$.

20. The organic light-emitting display panel according to claim 19, wherein $e2 = 29/16$.

* * * * *